United States Patent
Senoo et al.

(10) Patent No.: US 10,643,712 B2
(45) Date of Patent: May 5, 2020

(54) SEMICONDUCTOR MEMORY DEVICE FOR IMPROVING HIGH TEMPERATURE DATA RETENTION

(71) Applicant: Winbond Electronics Corp., Taichung (TW)

(72) Inventors: Makoto Senoo, Kanagawa (JP); Naoaki Sudo, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/361,242

(22) Filed: Mar. 22, 2019

(65) Prior Publication Data

US 2019/0221268 A1 Jul. 18, 2019

Related U.S. Application Data

(62) Division of application No. 15/666,576, filed on Aug. 2, 2017, now Pat. No. 10,304,543.

(30) Foreign Application Priority Data

Aug. 24, 2016 (JP) ................................. 2016-163678

(51) Int. Cl.
*G11C 16/04* (2006.01)
*G11C 16/16* (2006.01)
(Continued)

(52) U.S. Cl.
CPC ............. *G11C 16/16* (2013.01); *G11C 7/04* (2013.01); *G11C 16/0483* (2013.01);
(Continued)

(58) Field of Classification Search
CPC .................................................... G11C 16/16
(Continued)

(56) References Cited

U.S. PATENT DOCUMENTS

2012/0327720 A1  12/2012  Eguchi et al.
2017/0125116 A1*  5/2017  Shim .................. G11C 16/08

FOREIGN PATENT DOCUMENTS

CN     101366091     2/2009
CN     101471135     7/2009
(Continued)

OTHER PUBLICATIONS

"Office Action of Korea Counterpart Application," dated Jan. 21, 2019, p. 1-p. 9.
(Continued)

*Primary Examiner* — Hoai V Ho
(74) *Attorney, Agent, or Firm* — JCIPRNET

(57) ABSTRACT

A semiconductor memory device improving a high-temperature data retention is provided. Here, a flash memory includes an erasing element erasing a selected storage cell in a storage cell array. The erasing element further includes an applying element, a verifying element, and a decision element. The applying element applies a monitoring erasing pulse to a monitoring storage cell before starting an erasing operation for selecting the storage cell. The verifying element performs a verification of the monitoring storage cell to which the monitoring erasing pulse is applied. The decision element determines ISPE conditions based on a verification result of the verifying element. The erasing element erases the storage cell according to the determined ISPE conditions.

8 Claims, 8 Drawing Sheets

(51) Int. Cl.
*G11C 7/04* (2006.01)
*G11C 16/10* (2006.01)
*G11C 16/34* (2006.01)
*G11C 16/08* (2006.01)
*G11C 16/24* (2006.01)
*G11C 16/26* (2006.01)

(52) U.S. Cl.
CPC .............. *G11C 16/08* (2013.01); *G11C 16/10* (2013.01); *G11C 16/24* (2013.01); *G11C 16/26* (2013.01); *G11C 16/3445* (2013.01); *G11C 16/3459* (2013.01)

(58) Field of Classification Search
USPC ..................................................... 365/185.29
See application file for complete search history.

(56) References Cited

FOREIGN PATENT DOCUMENTS

| | | |
|---|---|---|
| CN | 101821812 | 9/2010 |
| JP | 2002150785 | 5/2002 |
| JP | 2005044454 | 2/2005 |
| JP | 2009151912 | 7/2009 |

OTHER PUBLICATIONS

"Office Action of China Counterpart Application," dated Nov. 28, 2019, p. 1-p. 8.

\* cited by examiner

SEMICONDUCTOR MEMORY DEVICE FOR IMPROVING HIGH TEMPERATURE DATA RETENTION

CROSS-REFERENCE TO RELATED APPLICATION

This application is a divisional application of and claims priority benefit of U.S. application Ser. No. 15/666,576, filed on Aug. 2, 2017, now allowed, which claims the priority benefit of Japan application serial no. 2016-163678, filed on Aug. 24, 2016. The entirety of each of the above-mentioned patent applications is hereby incorporated by reference herein and made a part of specification.

BACKGROUND OF THE INVENTION

Field of the Invention

The invention relates to a non-volatile semiconductor memory device; particularly, the invention relates to a programming operation and an erasing operation of a flash memory.

Description of Related Art

Flash memories are commonly applied in digital cameras, smartphones, and other electronic devices as storage devices. The market requires the flash memories to be minimized in size and maximized in storage space, high in speed, and low in power consumption. Further, it also requires the flash memories to have the capability of allowing certain data to be rewritten several times, data retention, and so forth.

In the typical flash memories, electrons are accumulated in the floating gate when the data are being programmed, such that the threshold voltage of the memory cell shifts towards the positive direction. The electrons are released from the floating gate when the data are being erased, such that the threshold voltage of the memory cell shifts towards the negative direction. Such programming and erasing operations need to be put under control by making the threshold value of the memory cell enter a distribution width of "0" or "1". Moreover, the memory cell needs to further enter a distribution width of "00," "01," "10," or "11" to control the programming and erasing operations when the memory cell stores a plurality of bits.

In the field of flash memories, it is known that the endurance and the degradation of data retention become more drastically when the memory cell is reduced in size (Patent Literature 1 and Non-patent Literature 1). FIG. 1 is a chart showing a programming/erasing cycle, wherein the longitudinal axis shows a threshold value of the memory cell, and the horizontal axis shows the number of programming/erasing cycle times. Here, $\Delta V_{SS}$ is subthreshold slope (SS) degradation, and $\Delta V_{MG}$ is midgap voltage (VMG) shifts. One can know from FIG. 1 that the threshold value Vt of the programming/erasing memory cell rarely varies when the number of the cycle times ranges around 10 to 1000. The threshold value Vt of the programming/erasing memory cell, however, gradually shifts towards the positive direction when the number of the cycle times passes around thousands. It is speculated that one of the reasons to such phenomena is: the electrons are trapped by a gate oxide film while the number of the programming/erasing cycle times increases. The gate oxide film itself undergoes a degradation due to the tunneling of the electrons. In Patent Literature 1, the voltage data of the programming pulses that reflect the properties of the programming/erasing cycle are stored in a spare region and are used to process the programming operation and the erasing operation, such that the excessive stress to the memory cell is repressed, or the erasing time is shortened.

RELATED ART

Patent Literature

[Patent Literature 1] Japan Patent Laid-Open Publication No. 5583185
[Non-Patent Literature 1] The new program/Erase Cycling Degradation Mechanism of NAND Flash Memory Devices, Albert Fayrushin, et al. Flash Core Technology Lab, Samsung Electronics Co, Ltd, IEDM09-823, P34.2.1-2.4

Problems Intended to be Solved by the Invention

Based on the above, since the number of the programming/erasing cycle times increases, when the gate insulation film undergoes a degradation, and the threshold value Vt of the programming/erasing memory cell shifts towards the positive direction, the high temperature data retention (HTDR) of the memory cell is deteriorated. Thereby, it is intended not to increase the threshold value of the memory cell as much as possible when the number of cycle times increases.

SUMMARY OF THE INVENTION

In the invention, said problems are to be solved through providing a semiconductor memory device capable of improving high temperature data retention (HTDR). Furthermore, a semiconductor memory device capable of repressing the increase of a threshold value of a memory cell as the number of programming/erasing cycle times increases.

Technical Means for Solving Problems

In an embodiment of the invention, a semiconductor memory device includes a non-volatile storage cell array and an erasing element configured to erase a selected storage cell of the storage cell array. The erasing element further includes a monitoring element and a decision element. The monitoring element is configured to monitor a threshold value variation of a monitoring storage cell before performing an erasing operation to the selected storage cell. The decision element is configured to determine an erasing voltage based on a monitoring result of the monitoring element.

It is preferred that the monitoring element includes an applying element and a verifying element. The applying element is configured to apply to the monitoring storage cell a monitoring erasing voltage smaller than the erasing voltage applied by the erasing element. The verifying element is configured to verify the monitoring storage cell to which the monitoring erasing voltage is applied. The decision element determines the erasing voltage based on a verifying result of the verifying element. It is preferred that the decision element determines the erasing voltage corresponding to the number of programming/erasing cycle times based on the verifying result of the verifying element. It is preferred that the decision element increases the erasing voltage as the number of the programming/erasing cycle times increases. It is preferred that the decision element determines an initial voltage of an erasing pulse. It is preferred that the decision element determines a step voltage of the erasing pulse. It is preferred that the decision element decreases a maximum number of times of applying an erasing pulse as the number of the programming/erasing cycle times increases. It is preferred that the verifying element determines a median threshold value among a plurality of threshold values of the monitoring storage cell. It is preferred that the monitoring storage cell is a storage cell in a block selected by the erasing element. It is preferred that the monitoring storage cell is the storage cell in a region of the selected block not used by a user.

In another embodiment of the invention, a semiconductor memory device includes a non-volatile storage cell array and a programming element configured to program a selected storage cell of the storage cell array. The programming element further includes a monitoring element and a decision element. The monitoring element is configured to monitor a threshold value variation of a monitoring storage cell before programming the selected storage cell, and the decision element is configured to determine a programming voltage based on a monitoring result of the monitoring element.

It is preferred that the monitoring element includes an applying element and a verifying element. The applying element is configured to apply to the monitoring storage cell a monitoring programming voltage smaller than the programming voltage applied by the programming element. The verifying element is configured to verify the monitoring storage cell to which the monitoring programming voltage is applied. The decision element determines the programming voltage based on a verifying result of the verifying element. It is preferred that the decision element determines the programming voltage corresponding to the number of programming/erasing cycle times based on the verifying result of the verifying element. It is preferred that the decision element decreases the programming voltage as the number of the programming/erasing cycle times increases. It is preferred that the decision element determines an initial voltage of a programming pulse. It is preferred that the decision element determines a step voltage of the programming pulse. It is preferred that the verifying element determines a median threshold value among a plurality of threshold values of the monitoring storage cell. It is preferred that the monitoring storage cell is a storage cell of a page selected by the programming element. It is preferred that the monitoring storage cell is the storage cell in a region of the selected page not used by a user.

Effects of the Invention

According to an embodiment of the invention, the threshold value variation of the monitoring storage cell is monitored during the erasing operation or the programming operation, and the monitoring result is used to determine the erasing voltage or the programming voltage. Thereby, an increase of the threshold value caused by an increase of the number of the programming/erasing cycle times may be repressed. As a result, data retention, especially HTDR, may be improved as compared to the data retention of conventional memory cells.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
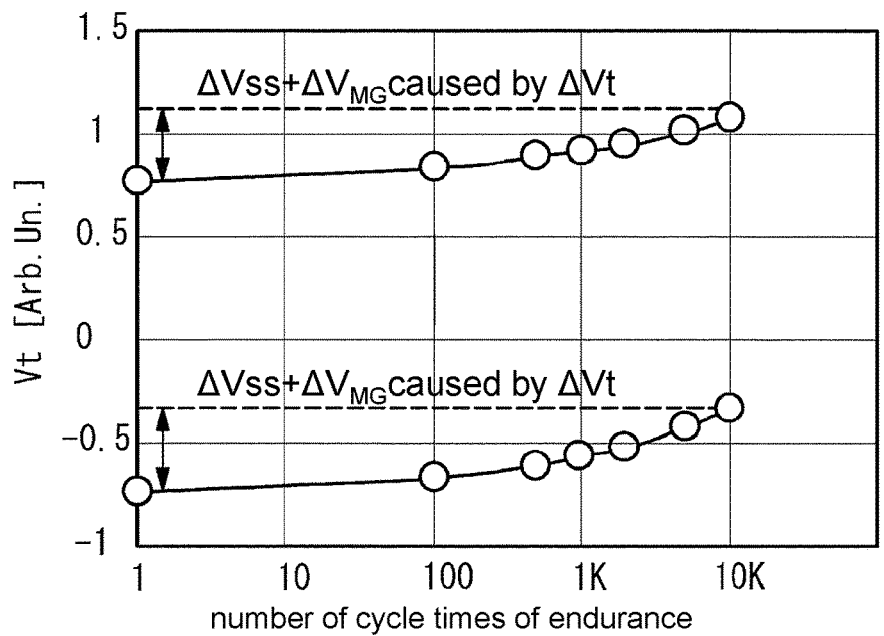
FIG. 1 is a chart showing a relation between the number of data rewriting times and a threshold value of a memory cell in a NAND flash memory.
Figure 2:
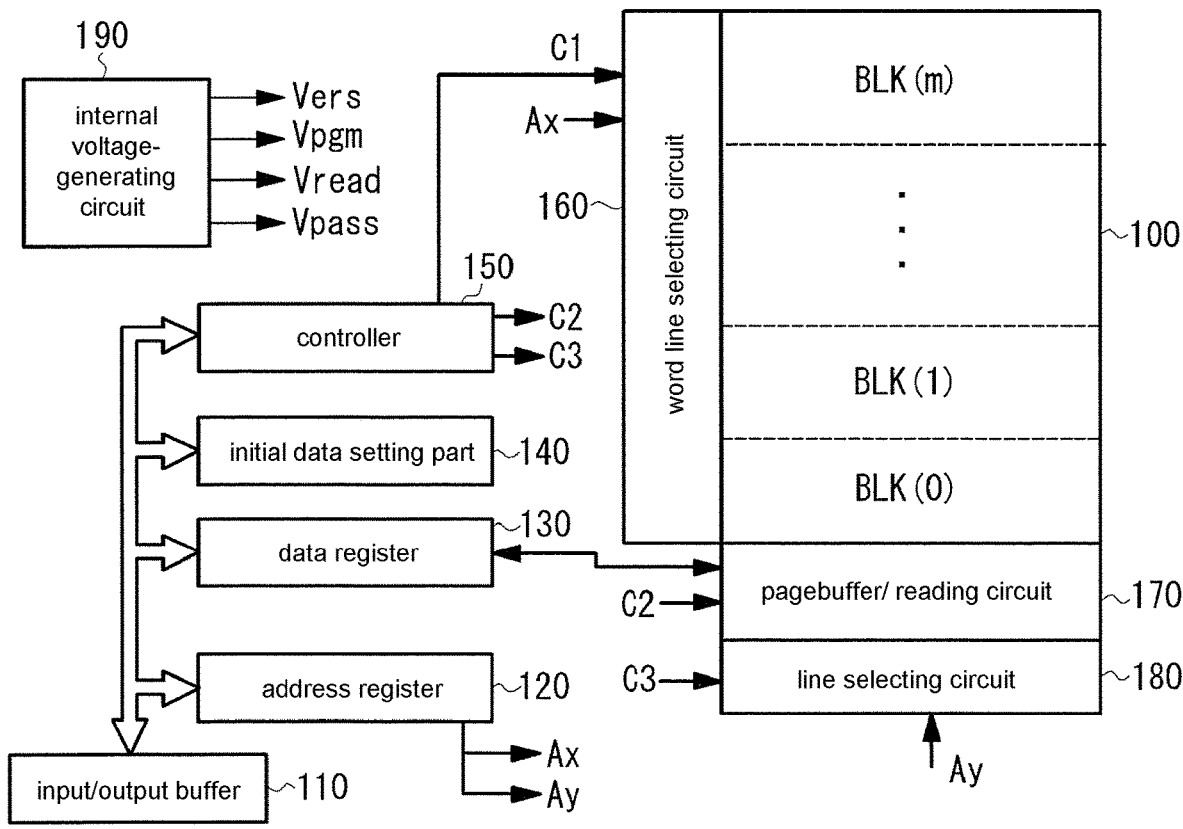
FIG. 2 is a block diagram showing an exemplary structure of a flash memory in an embodiment of the invention.

Please refer to the drawings for detailed descriptions on the embodiments of the invention hereinafter. A function of a flash memory is to store data of high capacity, such as dubbing the data recorded in a digital versatile disc (DVD) or preserving the data filmed by a digital camera. In such a flash memory, the number of times of rewriting data with high capacity is relatively small and thus does not necessarily require endurance but requires excellent data retention. On the other hand, the flash memory used for monitoring power supply or security strictly requires endurance. In the embodiment of the invention, the best programming voltage and the best erasing voltage for a storage cell are provided, so as to repress a threshold value variation of the storage cell caused by an increase of the number of cycle times, suppress a drastic degradation of the storage cell, and ensure the improvement of endurance and data retention.

Embodiments

The NAND flash memory 10 in the embodiment of the invention includes: a memory device array 100, an input/output buffer 110, an address register 120, a data register 130, an initial data setting part 140, a controller 150, a word line selecting circuit 160, a page buffer/reading circuit 170, a column selecting circuit 180, and an internal voltage generating circuit 190. The memory device array 100 has a plurality of storage cells arranged in a matrix. The input/output buffer 110 is connected to an external input/output terminal I/O. The address register 120 receives address data from the input/output buffer 110. The data register 130 preserves input/output data. The initial data setting part 140 sets an initial value of a programming pulse voltage or an erasing pulse voltage, a difference (step voltage) between the initial programming pulse voltage or the initial erasing pulse voltage and a later-applied programming pulse voltage or a later-applied erasing pulse voltage, a maximum number of times of applying a pulse, and other initial data in a non-volatile storage region. The controller 150 generates control signals C1, C2, C3, etc., wherein the control signals C1, C2, and C3 control all components based on command data from the input/output buffer 110 or an external control signal (not shown, e.g., a chip enable (CE), a command lock enable (CLE), an address lock enable (ALE), a ready/busy (RY/BY, etc.). The word line selecting circuit 160 decodes row address data Ax obtained from the address register 120 and processes a block selection and a word line selection based on a decoding result. The page buffer/reading circuit 170 preserves data read from a page selected by the word line selecting circuit 160 or preserves written data of the selected page. The column selecting circuit 180 decodes column address data Ay obtained from the address register 120 and selects a column of the memory cell based on a decoding result. The internal voltage generating circuit 190 generates voltages required for reading, programming, erasing, and verifying data, such as a programming voltage Vpgm of an incremental step pulse program (ISPP), a passing voltage Vpass, a reading passing voltage Vread, and an erasing voltage Vers of an incremental step pulse erase (ISPE).

The memory device array 100 has a plurality of blocks BLK(0), BLK(1), . . . , and BLK(m) arranged along a column direction. A plurality of NAND strings are formed in each of the blocks. One NAND string includes a plurality of serially connected memory cells, a bit line side selecting transistor connected to one terminal of the memory cell, and a source line side selecting transistor connected to the other terminal of the memory cell. The bit line side selecting transistor is connected to a corresponding bit line GBL. The source line side selecting transistor is connected to a common source line. A control gate of each of the memory cells is connected to one of the word lines. Gates of the bit line side selecting transistor and the source line side selecting transistor are respectively connected to selecting gate lines SGD and SGS. The word line selecting circuit 160 selects a block based on the row address data Ax and selectively drives the bit line side selecting transistor and the source line side selecting transistor through the selecting gate lines SGD and SGS in the block.

Table 1 shows bias voltages applied when the flash memory performs operations. When a reading operation is performed, a positive voltage is applied to the bit line, a voltage (e.g., 0V) is applied to the selecting word line, Vpass (e.g., 4.5V) is applied to a non-selecting word line, a positive voltage (e.g., 4.5V) is applied to the selecting gate lines SGD and SGS, and the bit line side selecting transistor and the source line side selecting transistor are switched on to set a common source line SL to 0V. During a programming operation, a high programming voltage Vpgm (15V to 20V) is applied to the selecting word line, a medium voltage (e.g., 10V) is applied to the non-selecting word line to switch on the bit line side selecting transistor and switch off the source line side selecting transistor, and an electric potential corresponding to data "0" or "1" is provided to the bit line GBL. During an erasing operation, 0V is applied to the selecting word line in the block, and a high voltage (e.g., 18V) is applied to a p-well to extract electrons from a floating gate to a substrate, so as to erase data by blocks.

TABLE 1

|  | Erasing | Writing | Reading |
|---|---|---|---|
| Selecting word line | 0 | 15-20 V | 0 |
| Non-selecting word line | F | 10 V | 4.5 |
| SGD | F | Vcc | 4.5 |
| SGS | F | 0 | 4.5 |
| SL | F | Vcc | 0 |
| P-well | 18-20 V | 0 | 0 |

Figures 3A, 3B:
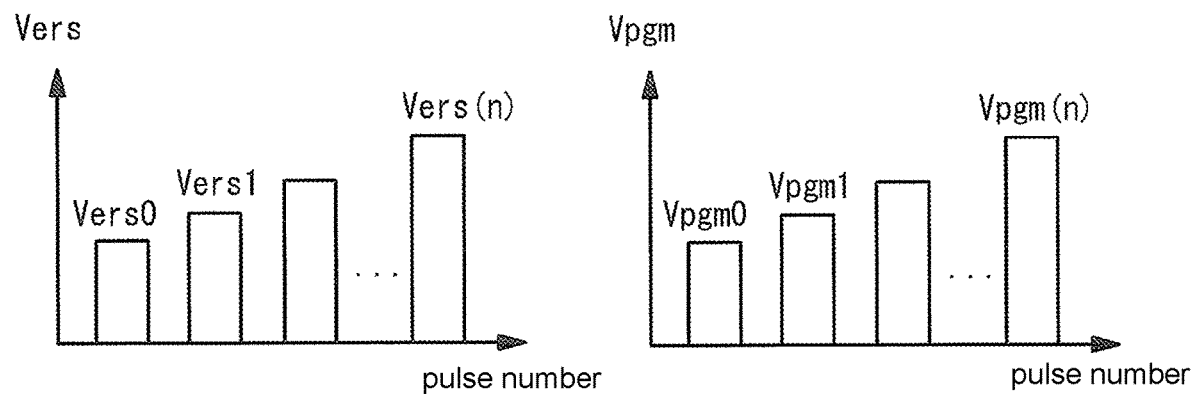
FIG. 3 (A) is a diagram illustrating ISPE, and FIG. 3 (B) is a diagram illustrating ISPP.

Detailed descriptions on the erasing operation and the programming operation of the flash memory in the embodiment of the invention are provided hereinafter. During the erasing operation, it is easy to erase data in one memory cell but difficult to erase data in another memory cell as the number of programming/erasing cycle times increases. Although the same erasing voltage is applied, the shift amounts of threshold values of the two memory cells are different, which may lead to the following: one memory cell releases sufficient electrons and arrives at a threshold value distribution width of "1"; however, another memory cell does not release sufficient electrons and does not arrive at the threshold value distribution width of "1". Thereby, a method of incremental step pulse erase (ISPE) is applied to accurately and more effectively release electrons from memory cells. As shown in FIG. 3(A), the method of ISPE is to apply an initial erasing pulse Vers0 to a selected block. After an erasing verification is done and determined as "fail", an erasing pulse Vers1 one level higher than the erasing pulse Vers0 is applied to the selected block to increase a voltage of the erasing pulse in order until the erasing operations on all the memory cells in the block are determined as qualified. Initial data including an initial value of the erasing pulse Vers0, a step voltage, and the maximum number of times of applying the erasing pulse Vers0 are pre-stored in the initial data setting part 140. The controller 150 refers to the initial data when performing the erasing operation. Moreover, if the erasing verification is still determined as "fail" while the number of times of applying the erasing pulse reaches the maximum value, the block is defined as a bad block for the purpose of management.

Similarly, in the programming operation, it is not limited to evenly accumulate electrons in the floating gates of all memory cells. If it is easy to inject electrons in one memory cell but difficult to inject electrons in another memory cell, the shift amounts of threshold values of the two memory cells are different even when the same programming voltage is applied, which may lead to the following: electrons accumulated in one memory cell are sufficient, and the amount of electrons arrives at a threshold value distribution width of "0"; however, electrons accumulated in another memory cell are insufficient, and the amount of electrodes fails to arrive at the threshold value distribution width "0". Thereby, a method of incremental step pulse program (ISPP) is applied to accurately and more effectively inject the electrons into memory cells. As shown in FIG. 3(B), the method of ISPP is to apply an initial programming pulse Vpgm0 to a selected page. After a programming verification is done and determined as "fail", a programming pulse Vpgm1 one level higher than the initial programming pulse Vpgm0 is applied to the selected block to increase a voltage of the programming pulse in order until the programming operations on all the memory cells in the selected page are determined as qualified. Initial data including an initial value of the programming pulse Vpgm0, a step voltage, and the maximum number of times of applying the programming pulse Vpgm0 is pre-set in the initial data setting part 140. The controller 150 refers to the initial data when performing the programming operation. Moreover, if the programming verification is still determined as "fail" while the number of times of applying the programming pulse reaches the maximum value, the programming operation is determined as "fail".

As shown in FIG. 1, when the number of programming/erasing cycle times increases, a threshold value Vt of a programming/erasing memory cell shifts towards a positive direction due to degradation of a tunnel oxide film or electrons being trapped. If the threshold value increases, data retention is deteriorated. Thereby, in the embodiment of the invention, an increase of the threshold value Vt of the memory cell caused by the increasing number of cycle times is repressed. During the programming or erasing operation, it is preferred to monitor a threshold value variation of a monitoring memory cell, and a programming/erasing voltage corresponding to the number of cycle times is determined according to the monitoring result, so as to avoid the increase of the threshold value of the memory cell. According to the related art, the programming/erasing voltage is determined by the initial data stored in the initial data setting part 140. In the embodiment of the invention, however, a scheme of dynamically changing the initial data in the initial data setting part 140 based on the monitoring result is applied.

Erasing Scheme

Figure 4:
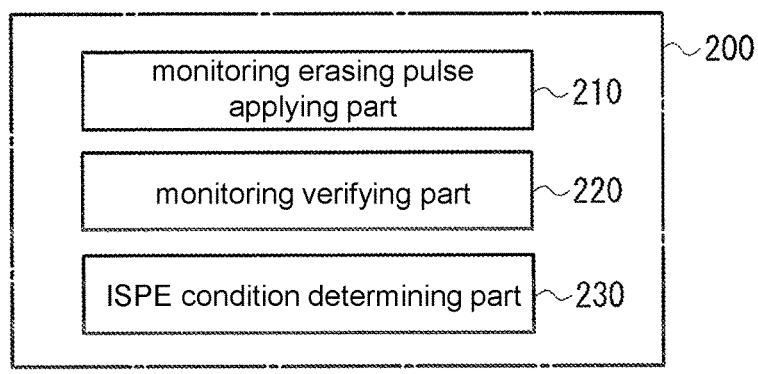
FIG. 4 is a block diagram showing a functional structure of an erasing operation of a flash memory in the embodiment of the invention.

FIG. 4 shows a functional structure of an erasing operation in the embodiment of the invention. The controller 150 performs an erasing operation by performing a programming operation or through a state machine. An erasing operation 200 includes a monitoring erasing pulse applying part 210, a monitoring verifying part 220, and an ISPE condition determining part 230.

In the embodiment of the invention, a monitoring operation is performed on a shift amount (or an erasing speed) of a threshold value of a monitoring memory cell before a main erasing pulse is applied according to ISPE. It is preferred that the monitoring memory cell is a plurality of memory cells or a flag cell for exclusive use in a region of a block which is selected during the erasing operation and is not used by a user. All of the monitoring memory cells contain the data "0". The shift amounts of threshold values of all monitoring memory cells in the selected block are determined according to the shift amount of threshold values of a limited number of the monitoring memory cells in the region not used by a user. For example, if the selected block includes 64 pages, and a page stores 2 KB of data, then each block contains 1 Mb of data in the memory cells, and monitoring the shift amounts of threshold values of all the memory cells is very complicated. In order to reduce the computation and processing load, only the limited number of monitoring memory cells in the region not used by a user is monitored. The above is merely an example, and the monitoring memory device may also be a memory cell in other regions of the selected block.

Figure 5:
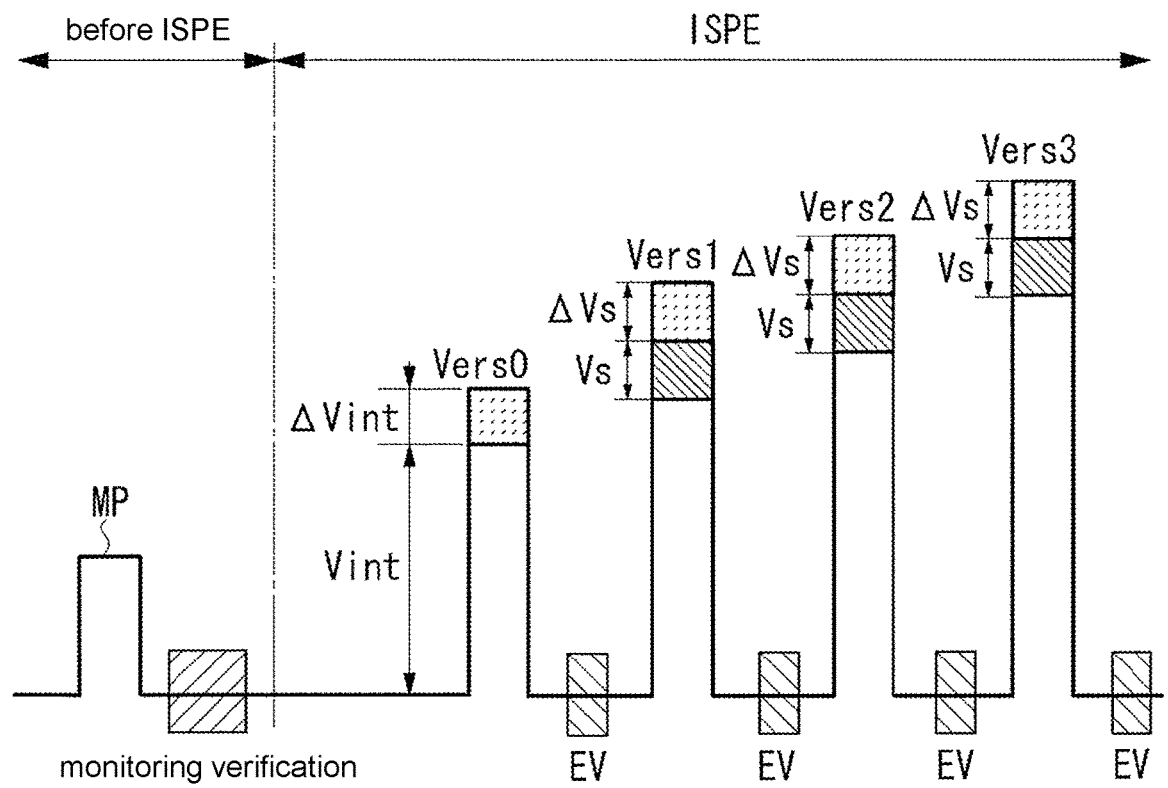
FIG. 5 is a diagram showing a monitoring operation before a main erasing operation and an erasing operation is performed in an embodiment of the invention.
Figure 6:
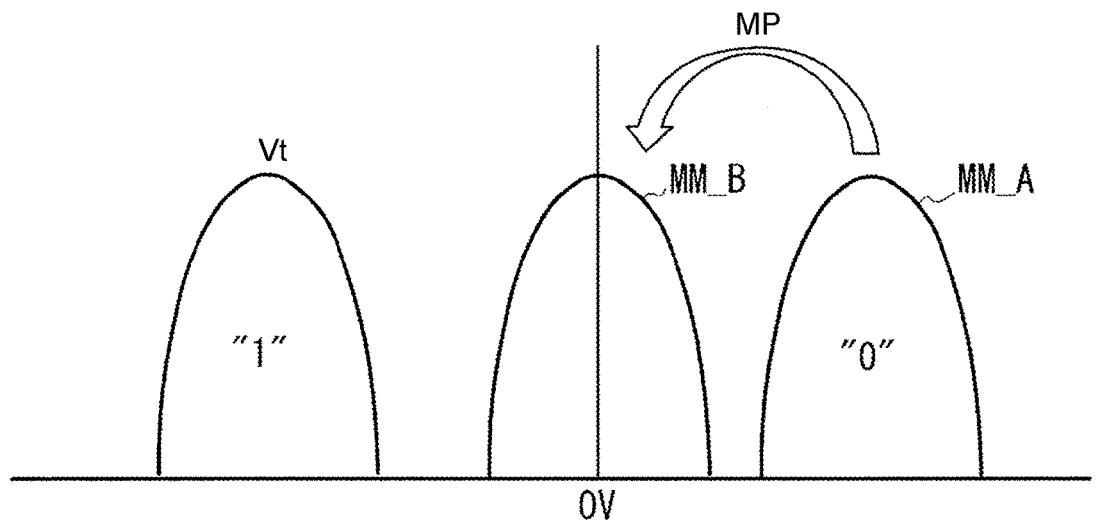
FIG. 6 is a diagram showing a situation when a threshold value distribution width shifts towards a negative direction due to an application of a monitoring erasing pulse.

As shown in FIG. 5, before the main erasing pulse is applied according to ISPE, the monitoring erasing pulse applying part 210 applies to the selected block a monitoring erasing pulse MP with a lower voltage level than that of the initial erasing pulse Vers0 applied after ISPE is passed. The voltage level of the monitoring erasing pulse MP and an application time are pre-set. EV stands for erasing verification. FIG. 6 is a diagram showing a threshold value variation of a monitoring memory cell to which the monitoring erasing pulse MP is applied. When the monitoring erasing pulse MP is applied to the monitoring memory cell, a threshold value distribution width MM_A of the data "0" shifts towards a negative direction and becomes a threshold value distribution width MM_B.

The monitoring verifying part 220 performs a verification on the monitoring memory cell to which the monitoring erasing pulse MP is applied. The monitoring verifying part 220 performs a check on the shift amount of the threshold value (or an erasing speed) of the monitoring memory cell by performing a verification on the threshold value distribution width MM_B. In a preferred exemplary embodiment, a median threshold value of the threshold value distribution width MM_B is calculated through the monitoring verification and is taken as the shift amount or an erasing speed of the threshold value of the monitoring memory cell. The above is merely an example, and an average threshold value of the threshold value distribution width MM_B may also be calculated.

Figure 7:
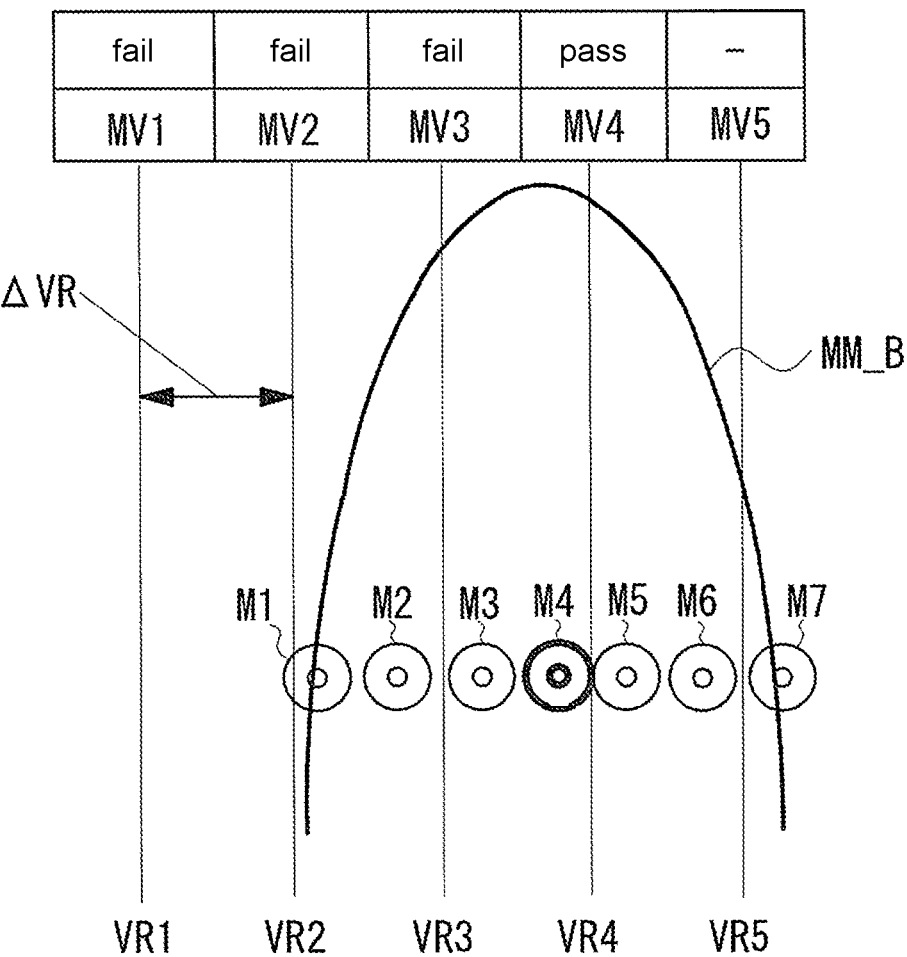
FIG. 7 is a diagram showing a monitoring verification in an embodiment of the invention.

FIG. 7 shows a concrete example of calculating a median value. For easier understanding, the number of monitoring memory cells is assumed to be seven (M1 to M7) hereinafter. The monitoring verifying part 220 performs, for example, a scan on the threshold value distribution width MM_B in an order from the low voltage to the high voltage, so as to detect a median value. FIG. 7 shows that the threshold value distribution width MM_B is scanned by means of the monitoring verifications MV1, MV2, MV3, MV4, and MV5. The monitoring verifications MV1 to MV5 are respectively done through applying the reading voltages VR1, VR2, VR3, VR4, and VR5. The difference between the reading voltages is $\Delta VR$. $VR2=VR1+\Delta VR$, $VR3=VR1+2\Delta VR$, $VR4=VR1+3\Delta VR$, and $VR5=VR1+4\Delta VR$.

There are seven monitoring memory cells, and thus the fourth threshold value is a median value of all. In the monitoring verifications MV1 and MV2 in FIG. 7, the threshold values of all the memory cells are bigger than VR1 and thus are verified as "fail". In the monitoring verification MV3, the threshold values of the five memory cells are bigger than VR3 and are still verified as "fail" for not reaching the median value. In the monitoring verification MV4, the threshold values of the three memory cells are bigger than VR4 and thus are verified as qualified for reaching the median value. In other words, the memory cell having the median threshold value is between VR3 and VR4. At this time, the maximum reading voltage VR4 is determined as the shift amount of the threshold values. The monitoring verifying part 220 provides the verifying result to the ISPE condition determining part 230. Moreover, if no qualified median threshold value can be obtained through the monitoring verification MV1 to MV5, a voltage read in the last step of the monitoring verifications (which is VR5 in the embodiment) is determined as the shift amount of the threshold values and is provided to the ISPE condition determining part 230. It should be noted that the threshold value of a memory cell in the monitoring verifying part 220 may be negative. In order to read the negative threshold value, the monitoring verifying part 220 performs a reverse read through supplying the voltage from a source line side.

The ISPE condition determining part 230 determines the best ISPE condition corresponding to the number of programming/erasing cycle times in the selected block based on the qualified verifying voltage VR4 (the median threshold value) in the monitoring verifying part 220. In other words, when the number of cycle times increases, an erasing speed tends to be slowed down, and the shift amount of threshold values tends to decrease. As a result, the ISPE condition determining part 230 raises an erasing voltage as the number of cycle times increases. In a preferred embodiment, according to the relation between the threshold value variation and the number of cycle times (a table or a function regulating the relation between the two) obtained through the empirical rule or known measured data, the ISPE condition determining part 230 determines an ISPE condition corresponding to the shift amount of the threshold values of the memory cells decided in the monitoring verification, i.e., an initial value of the erasing voltage, a step voltage, the maximum number of times of applying an erasing pulse, etc. The ISPE condition determining part 230 compares the determined content with the initial data set in the initial data setting part 140 and changes the initial data if the determined content and the initial data are different.

The initial data setting part 140 as shown in FIG. 5 includes an initial value Vint of the erasing pulse, a step voltage Vs of the erasing pulse, and the maximum number of times of applying the erasing pulse (four times from Vers0 to Vers3 in FIG. 5). The ISPE condition determining part 230 deduces the number of cycle times from a monitoring result of the monitoring verifying part 220 and adds the best corrected value ΔVint to the initial value Vint of the erasing pulse if the erasing speed is slowed down, such that the initial erasing voltage is changed to Vint+ΔVint. Further, the ISPE condition determining part 230 adds the best corrected value ΔVs to the step voltage Vs, so as to change the step voltage to Vs+ΔVs. Furthermore, the stress applied to the memory cell is increased by raising the initial value and the step voltage of the erasing pulse, and the maximum number of times of applying the erasing pulse is also reduced.

Figure 8:
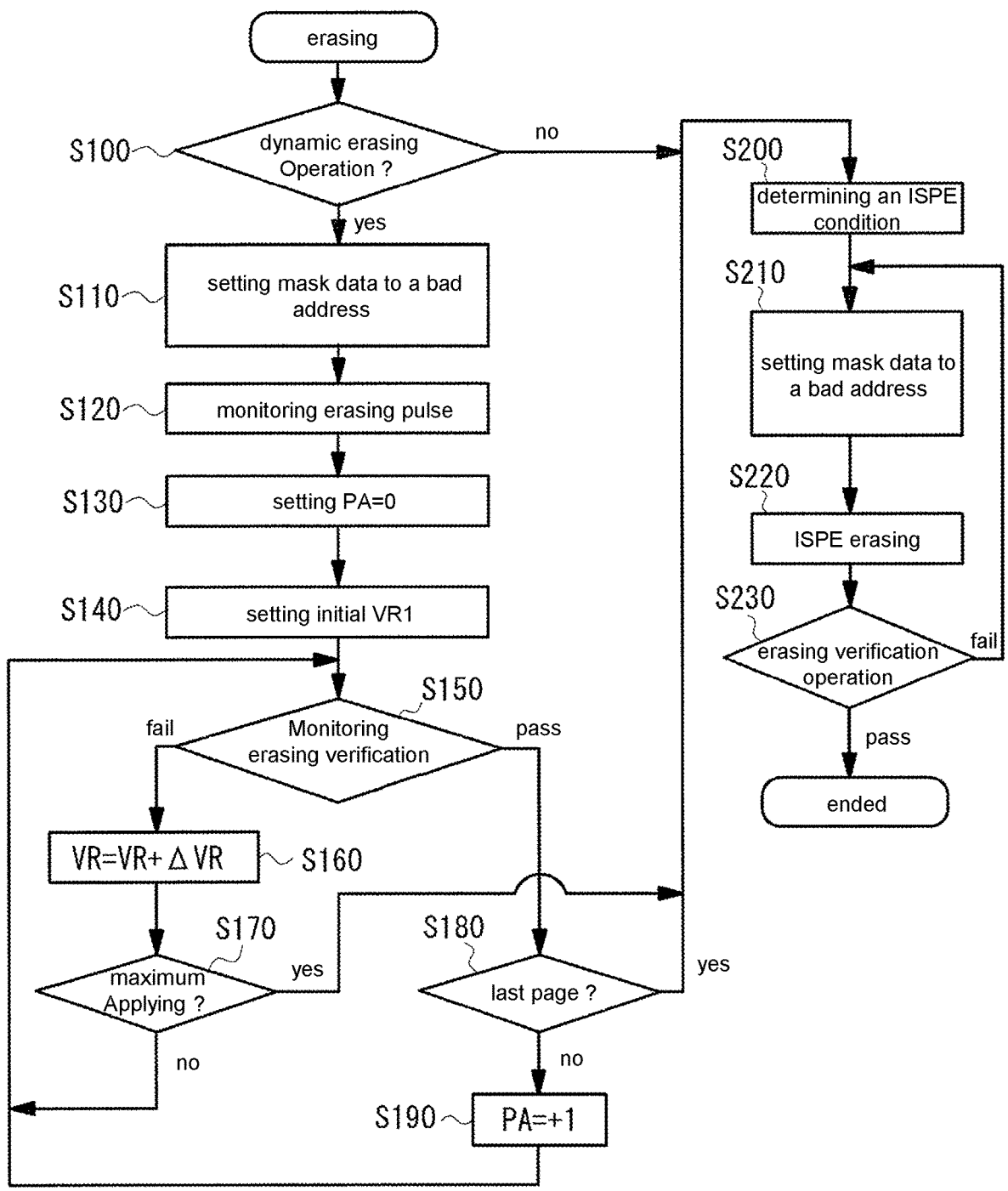
FIG. 8 is a flow chart showing an erasing operation in an embodiment of the invention.

A flow chart of the erasing operation of the embodiment of the invention is shown in FIG. 8. When receiving an erasing command and an address from the outside, the controller 150 executes an erasing sequence corresponding to the erasing command. The controller 150 determines whether the erasing command requires a dynamic erasing operation (S100) corresponding to the number of programming/erasing cycle times. If the dynamic erasing operation is not required, then the controller 150 performs a regular erasing operation.

When the dynamic erasing operation is required, the controller 150 refers to the redundant data of the row address and sets mask data (S110) of a latch in the page buffer/reading circuit 170 corresponding to a bad address (e.g. an open bad address of a global bit line). In other words, the mask data is set as "1" in the latch. The monitoring verification of the memory cells is always deemed passed, regardless of the state of the memory cells. Since the redundant address is mandatorily set as "1", false determination caused by defects may be avoided.

Then, a monitoring erasing pulse is applied to the selected block (S120). A bias voltage condition on which the monitoring erasing pulse is applied is identical to a bias voltage condition on which the erasing operation is performed. A voltage of a monitoring erasing pulse applied to a p-well, however, is smaller than a voltage of the erasing pulse applied in the normal ISPE. Thereafter, the monitoring verifying part 220 verifies an initial page of the selected block and sets PA=0 (S130), and the monitoring verifying part 220 sets an initial reading voltage VR as VR1 (S140), as shown in FIG. 7, performs a verification (S150) on the monitoring memory cells. If the verification fails, the reading voltage VR is changed to VR+ΔVR (S160). If the pre-set maximum applying number of times is not reached, then the monitoring verification is performed repeatedly. When changes of the reading voltage VR reach the maximum number of times (S170), the monitoring verification is ended at this moment and is switched to a regular erasing process. Moreover, when the monitoring verification is passed (S150), it is determined whether a page is the last page of the selected block (S190). If the page is not the last page, then PA is set as PA+1 (S190), and the monitoring verification is performed repeatedly on the next page. Additionally, the sequence of motion exemplarily shows a sampling process performed on all pages. If an upper range value of the threshold values is determined as unqualified in the verification even for once before the sampling process is performed on all the pages, the shift amount is determined according to the maximum reading voltage (which is VR5 in the embodiment of FIG. 7). If failure of the verification does not occur even for once before the sampling process is performed on all the pages, the shift amount is determined according to the maximum reading voltage (which is any of VR1 to VR5 in the embodiment of FIG. 7) among all threshold values detected from the pages.

An erasing operation is performed on the selected block if the monitoring verification is ended or if a dynamic erasing operation is not required. The ISPE condition determining part 230 reads the initial data set by the initial data setting part 140 and determines an ISPE condition (S200). When the dynamic erasing operation is not required, the ISPE condition determination part 230 determines the ISPE condition according to the set initial data. When the dynamic erasing operation is required, the ISPE condition corresponding to the number of cycle times is determined according to the median threshold value obtained through a result of the monitoring verification. When the condition is different from the set initial data, the initial data are changed.

After that, the controller 150 sets the mask data to a bad address and performs a mask processing to the bad address (S210) as in step S110. Then, an erasing operation based on ISPE is performed according to the determined ISPE condition (S220). Later, a normal erasing verification (S230) is performed. If the erasing verification fails, then the mask data to the bad address are set again, and the erasing operation is performed repeatedly. When the erasing verification is passed, the erasing operation is ended.

Programming Scheme

Figure 9:
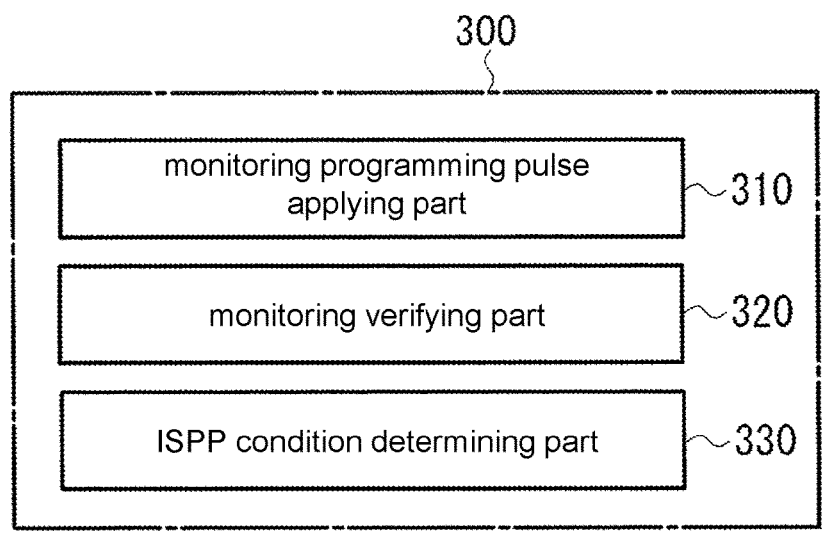
FIG. 9 is a block diagram showing a functional structure of a programming operation of a flash memory in the embodiment of the invention.

Descriptions on a programming operation are provided hereinafter. FIG. 9 is a block diagram showing a functional structure of a programming operation 300 in the embodiment of the invention. The programming operation 300 includes a monitoring programming pulse applying part 310, a monitoring verifying part 320, and an ISPP condition determining part 330.

Figure 10:
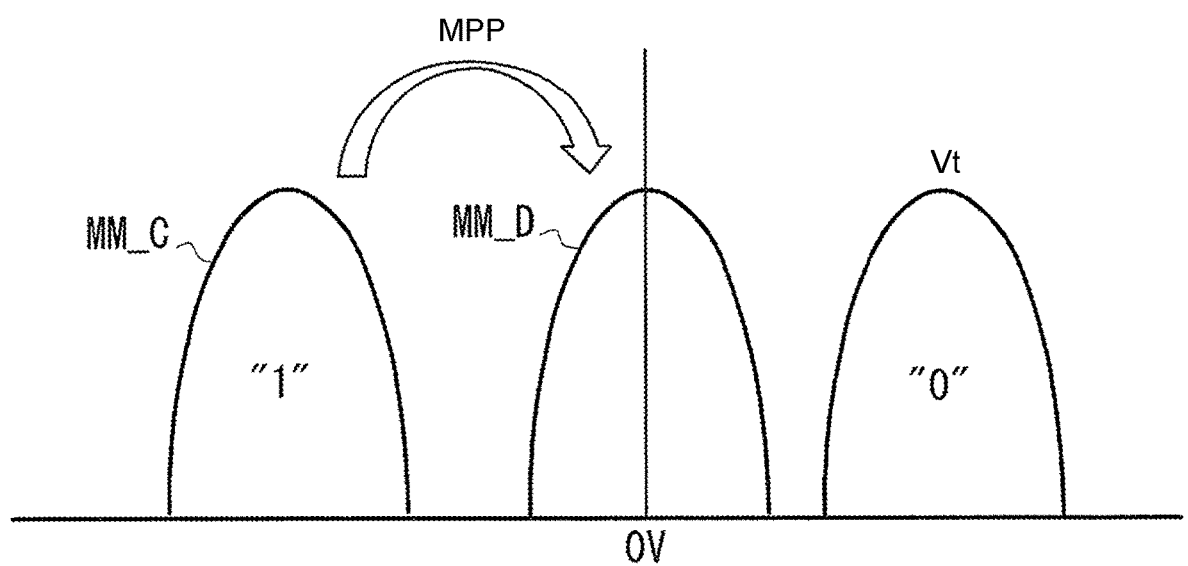
FIG. 10 is a diagram showing a situation when a threshold value distribution width shifts towards a positive direction due to an application of a monitoring erasing pulse.

The monitoring programming pulse applying part 310 applies a monitoring programming pulse with a voltage level lower than that of an initial programming pulse Vpgm0 applied in ISPP to a selected page before applying a main programming pulse based on the ISPP. The voltage level and the time of applying the monitoring programming pulse MPP are pre-set. FIG. 10 is a diagram showing a threshold value variation of memory cells to which the monitoring programming pulse MPP is applied. The monitoring memory cell stores the data "1". When the monitoring programming pulse MPP is applied to the monitoring memory cell, a threshold value distribution width MM_C of the data "1" shifts towards a positive direction and becomes a threshold value distribution width MM_D.

The monitoring verifying part 320 in fact performs an identical operation as the monitoring verifying part 220 does. In other words, the monitoring verifying part 320 determines a median threshold value by scanning the threshold value distribution width MM_D through a plurality of voltages read from verifications. Additionally, a reverse read through supplying the voltage from a source line side is also performed in the monitoring verification to read a negative threshold value.

The ISPP condition determining part 330 determines the best ISPP condition corresponding to the number of programming/erasing cycle times based on a verifying result of the monitoring verifying part 320. In other words, a programming speed tends to be increased, and a shift amount of threshold values tends to be increased as the number of cycle times increases. As a result, the ISPP condition determining part 330 reduces a programming voltage as the number of cycle times increases. In a preferred embodiment, according to the relation between the threshold value variation and the number of cycle times (a table or a function regulating the relation between the two) obtained through the empirical rule or known measured data, the ISPE condition determining part 330 determines an ISPP condition corresponding to the shift amount of the threshold values of the memory cells decided in the monitoring verification, i.e., an initial value of the erasing voltage, a step voltage, the maximum number of times of applying a programming pulse, etc. The ISPP condition determining part 330 compares the determined content with the initial data set in the initial data setting part 140 and changes the initial data if the determined content and the initial data are different.

Figure 11:
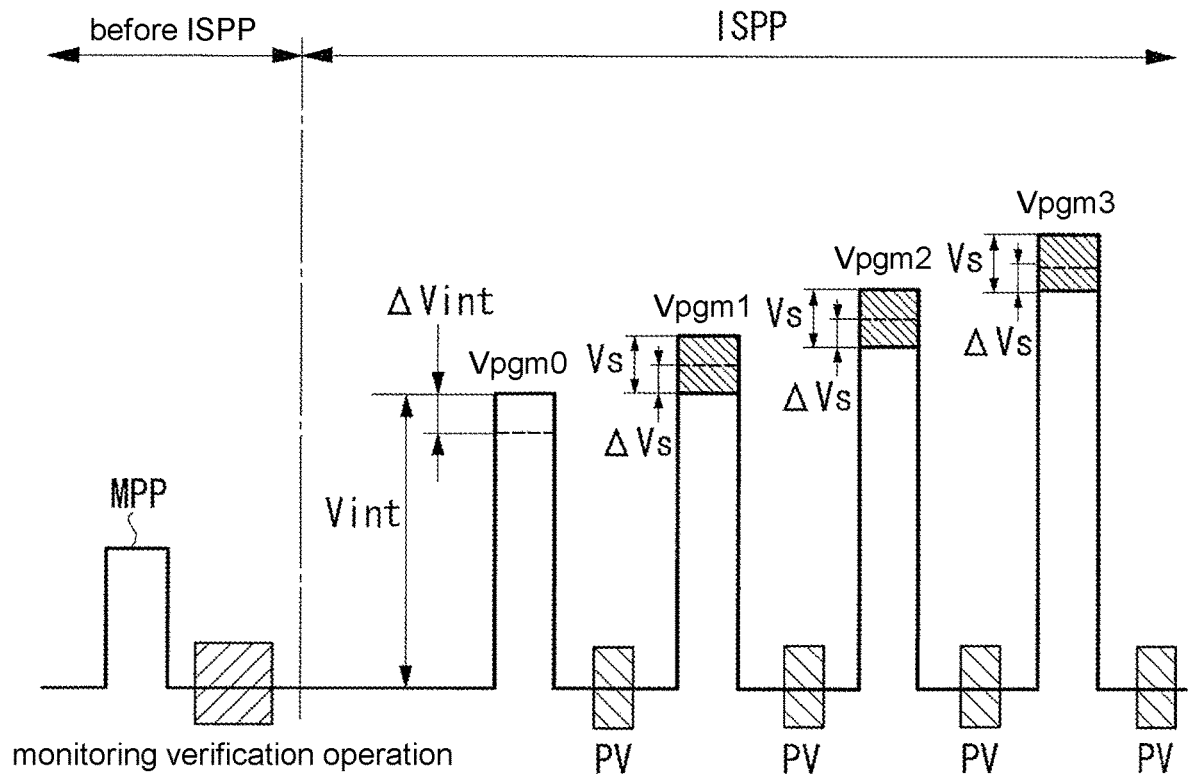
FIG. 11 is a diagram showing a monitoring operation before a main programming operation and a programming operation is performed in an embodiment of the invention.

The initial data setting part 140 as shown in FIG. 11 includes an initial value Vint of the programming pulse, a step voltage Vs of the programming pulse, and the maximum number of times of applying the programming pulse (four times from Vpgm0 to Vpgm3 in FIG. 11). The ISPP condition determining part 330 deduces the number of cycle times from a monitoring result of the monitoring verifying part 320 and subtracts a corrected value ΔVint from the initial value Vint of the programming pulse if the programming speed raises, so as to change an initial programming voltage to Vint−ΔVint. Further, the step voltage Vs is changed to the best corrected value Vs−ΔVs (ΔVs<Vs).

Figure 12:
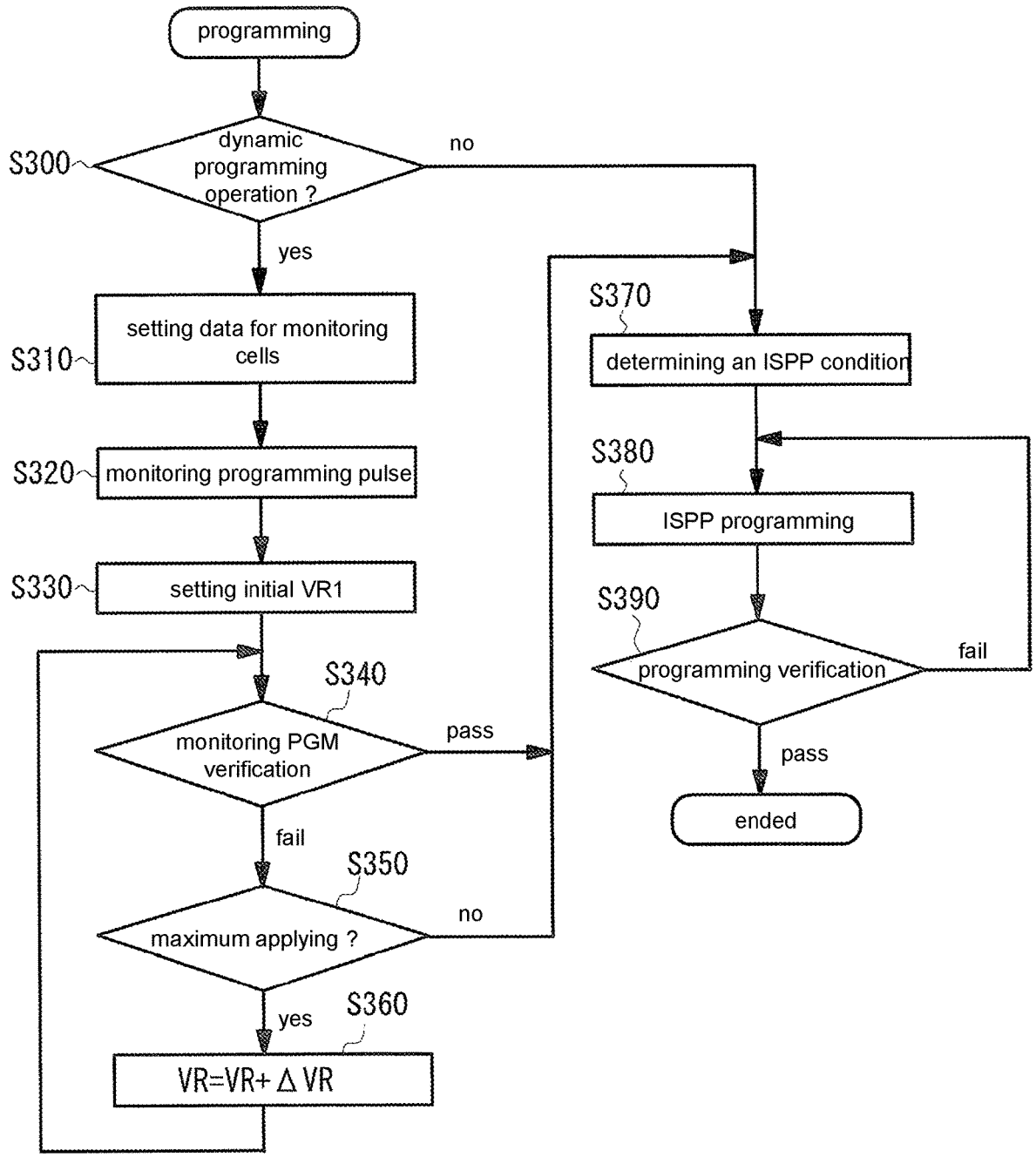
FIG. 12 is a flow chart showing a programming operation in an embodiment of the invention.

A flow chart of the programming operation of the invention is then shown in FIG. 12, wherein PV stands for programming verification. When receiving a programming command, an address, and programming data from the outside, the controller 150 executes a programming sequence corresponding to the programming command. The controller 150 determines whether the programming command requires a dynamic erasing operation (S300) corresponding to the number of programming/erasing cycle times. If the dynamic programming operation is not required, then the controller 150 performs a regular programming operation.

On the other hand, when a dynamic programming operation is required, the controller 150 is capable of performing a programming operation of the monitoring memory cells, so as to set data "0" (S310) in a latch of a page buffer/reading circuit 170 corresponding to the monitoring memory cells. The data setting is carried out through an internal circuit. Next, a monitoring programming pulse is applied to the selected page (S320). A bias voltage condition on which the monitoring programming pulse is applied is identical to a bias voltage condition on which the programming operation is performed. A voltage of a monitoring programming pulse applied to the selecting word line, however, is smaller than a voltage of the programming pulse applied in the normal ISPP. Following the above, the monitoring verifying part 320 sets an initial reading voltage VR as VR1 (S330), and the monitoring verifying part 330 verifies a monitoring memory cell. (S340). If the verification fails, whether a change of the reading voltage VR reaches the maximum number of times is determined (S350). If the change of the reading voltage VR does not reach the maximum number of times, the reading voltage VR is changed to VR+ΔVR (S360), and the monitoring programming verification is performed repeatedly. When the change of the reading voltage VR reaches the maximum number of times or when the monitoring verification is passed (S150), a normal programming operation of the selected page is executed. The same process applies even when a dynamic programming operation is not required.

The ISPP condition determining part 330 reads the initial data set by the initial data setting part 140 and determines an ISPP condition (S370). When a dynamic programming operation is not required, the ISPP condition determining part 330 determines an ISPP condition according to the set initial data. When the dynamic programming operation is required, the ISPP condition corresponding to the number of cycle times is determined according to the median threshold value obtained through a result of the monitoring programming verification. When the condition is different from the set initial data, the initial data are changed. Following the above, a programming operation based on the ISPP is performed according to the determined ISPP condition (S380), and later a normal programming verification is performed. When all the memory cells pass the programming verification (S390), the programming operation is ended.

Thereby, according to the embodiment of the invention, the monitoring memory cells are configured to monitor a variation amount or a variation speed of the threshold values and dynamically change the ISPE condition or the ISPP condition based on the monitoring result when an erasing operation or a programming operation is performed, so as to avoid the increase of the threshold values caused by the increase of the number of cycle times. As a result, the HTDR of the memory cells may be improved as compared to the data retention of conventional memory cells.

In the embodiment of the invention, the step voltage of ISPE or ISPP is set as a fixed value based on the monitoring verification, but the step voltage does not need to be a fixed value. For instance, the step voltage may also be reduced or raised when the number of times of the erasing pulse increases. Furthermore, a NAND flash memory is exemplarily used in the embodiment of the invention, but the invention is not limited to the NAND flash memory. A NOR flash memory is also applicable in the invention. Moreover, memory cells of which the threshold values change according to the number of programming/erasing cycle times in the invention may also be applied to any other non-volatile memory in addition to the flash memory.

Further, the invention may be applied in any of a flash memory of which memory cells store binary data and a flash memory of which memory cells store multinary data. Moreover, the invention may be applied in any of a two-dimensional flash memory in which a NAND string of a memory device array is formed on a surface of a substrate and a three-dimensional memory device in which a NAND string is formed on a conductive layer (e.g., a polysilicon layer) on a surface of a substrate.

Detailed descriptions on the embodiments of the invention are provided as above. The invention, however, is not limited to a certain embodiment, and various modifications and variations can be made without departing from the scope of the claims of this invention.

What is claimed is:

1. A semiconductor memory device comprising;
a non-volatile storage cell array; and
an erasing element configured to erase a selected storage cell of the storage cell array, the erasing element further comprising:
  a monitoring element configured to monitor a threshold value variation of a monitoring storage cell before performing an erasing operation to the selected storage cell; and
  a decision element configured to determine an erasing voltage based on a monitoring result of the monitoring element,
    wherein the monitoring element comprises a verifying element, the verifying element is configured to verify the monitoring storage cell to which the monitoring erasing voltage is applied,
    the verifying element determines a median threshold value among a plurality of threshold values of the monitoring storage cell.

2. The semiconductor memory device of claim 1, wherein the monitoring element comprises:
  an applying element configured to apply to the monitoring storage cell a monitoring erasing voltage smaller than the erasing voltage applied by the erasing element,
  wherein the decision element determines the erasing voltage based on a verifying result of the verifying element.

3. The semiconductor memory device of claim 2, wherein the decision element determines the erasing voltage corresponding to the number of programming/erasing cycle times based on the verifying result of the verifying element.

4. The semiconductor memory device of claim 3, wherein the decision element increases the erasing voltage as the number of the programming/erasing cycle times increases.

5. The semiconductor memory device of claim 1, wherein the decision element determines an initial voltage and a step voltage of an erasing pulse.

6. The semiconductor memory device of claim 1, wherein the decision element decreases a maximum number of times of applying an erasing pulse as the number of programming/erasing cycle times increases.

7. The semiconductor memory device of claim 1, wherein the monitoring storage cell is a storage cell in a block selected by the erasing element.

8. The semiconductor memory device of claim 7, wherein the monitoring storage cell is the storage cell in a region of the selected block not used by a user.

* * * * *